US009578228B2

(12) United States Patent
Shoda et al.

(10) Patent No.: US 9,578,228 B2
(45) Date of Patent: Feb. 21, 2017

(54) FOCUS DETECTION APPARATUS, IMAGE PICKUP APPARATUS, IMAGE PICKUP SYSTEM, AND FOCUS DETECTION METHOD

(71) Applicant: CANON KABUSHIKI KAISHA, Tokyo (JP)

(72) Inventors: Satoshi Shoda, Utsunomiya (JP); Takeshi Ogawa, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 175 days.

(21) Appl. No.: 14/086,390

(22) Filed: Nov. 21, 2013

(65) Prior Publication Data

US 2014/0146196 A1 May 29, 2014

(30) Foreign Application Priority Data

Nov. 29, 2012 (JP) ................................ 2012-261430

(51) Int. Cl.
*H04N 5/232* (2006.01)
*H01L 27/146* (2006.01)
*H04N 5/369* (2011.01)

(52) U.S. Cl.
CPC .... *H04N 5/23212* (2013.01); *H01L 27/14627* (2013.01); *H04N 5/3696* (2013.01)

(58) Field of Classification Search
None
See application file for complete search history.

(56) References Cited

U.S. PATENT DOCUMENTS 9,030,596 B2 * 5/2015 Shoda ................ H04N 5/23212 348/222.1
2010/0091161 A1 * 4/2010 Suzuki ............. H01L 27/14609 348/302

FOREIGN PATENT DOCUMENTS

JP 2001-083407 A 3/2001
JP 4691930 B2 6/2011
JP 2013-235054 A 11/2013

OTHER PUBLICATIONS

Japanese office action issued in corresponding application No. 2012-261430 on Jul. 26, 2016.

* cited by examiner

*Primary Examiner* — Roberto Velez
*Assistant Examiner* — Yih-Sien Kao
(74) *Attorney, Agent, or Firm* — Carter, DeLuca, Farrell & Schmidt, LLP

(57) ABSTRACT

A focus detection apparatus performs focus detection of a phase difference method by using signals from an image pickup element including a first pixel and a second pixel sharing one micro lens, and the focus detection apparatus includes a first saturation detector configured to detect saturation of a first signal obtained from the first pixel, a second saturation detector configured to detect saturation of a second signal obtained from the second pixel, a luminance generating portion configured to generate luminance signals of the first signal and the second signal after detecting the saturations of the first signal and the second signal are detected, and a processor configured to perform a correlation calculation based on the luminance signals.

11 Claims, 5 Drawing Sheets

FOCUS DETECTION APPARATUS, IMAGE PICKUP APPARATUS, IMAGE PICKUP SYSTEM, AND FOCUS DETECTION METHOD

BACKGROUND OF THE INVENTION

Field of the Invention

The present invention relates to a focus detection apparatus which performs focus detection of a phase difference method by obtaining pupil-divided images through an image pickup element including a plurality of pixels sharing one micro lens.

Description of the Related Art

Conventionally, a focus detection apparatus (an image pickup apparatus) including a plurality of divided photoelectric conversion devices (hereinafter, referred to as "PDs") with respect to one pixel corresponding to one micro lens (hereinafter, referred to as an "ML") which perform focus detection of phase difference method while taking an image has been known.

Japanese Patent Laid-open No. 2001-83407 discloses a configuration to obtain pupil-divided image signals by divided photoelectric conversion devices (hereinafter, referred to as "divided PDs") to perform focus detection process of a phase difference method. In the configuration disclosed in Japanese Patent Laid-open No. 2001-83407, an imaging pixel signal is obtained by treating an added value output from the divided PDs corresponding to the same micro lens as an output of one pixel.

Japanese Patent No. 4691930 discloses a method of reading a part of the divided PDs (one of the divided PDs) in a non-destructive manner in order to improve characteristics of high sensitivity in a divided pixel structure, and then reading the added value of each of the divided PDs to estimate pixel value of the other of the divided PDs by performing a calculation.

When the divided PDs disclosed in Japanese Patent Laid-open No. 2001-83407 and Japanese Patent No. 4691930 are saturated, excess charges due to the saturation (charges corresponding to the saturation) leaked to adjacent divided PDs. Therefore, deterioration is caused in a phase difference image by a signal of a divided PD corresponding to the same micro lens with a saturated divided PD due to the leakage of the excess charges. In view of this, it is preferred that saturation detection is performed in each divided PD before focus detection to perform a focus detection process by taking saturation of each divided PD into consideration.

However, when a signal of each of the divided PDs is converted into a luminance component signal before the saturation is detected in the configuration disclosed in Japanese Patent No. 4691930, the other luminance component signal is to be calculated based on the calculation of the luminance component signals, and thus, an original signal of each of the divided PDs corresponding to the calculated luminance component signal cannot be recognized. As a result, it is difficult to perform highly accurate focus detection.

BRIEF SUMMARY OF THE INVENTION

The present invention provides a focus detection apparatus, an image pickup apparatus, an image pickup system, and a focus detection method which improve focus detection accuracy.

A focus detection apparatus as one aspect of the present invention performs focus detection of a phase difference method by using signals from an image pickup element including a first pixel and a second pixel sharing one micro lens, and the focus detection apparatus includes a first saturation detector configured to detect saturation of a first signal obtained from the first pixel, a second saturation detector configured to detect saturation of a second signal obtained from the second pixel, a luminance generating portion configured to generate luminance signals of the first signal and the second signal after detecting the saturations of the first signal and the second signal are detected, and a processor configured to perform a correlation calculation based on the luminance signals.

An image pickup apparatus as another aspect of the present invention includes the focus detection apparatus.

An image pickup system as another aspect of the present invention includes the image pickup apparatus and a lens unit removably mounted on the image pickup apparatus.

A focus detection method as another aspect of the present invention performs focus detection of a phase difference method by using signals from an image pickup element including a first pixel and a second pixel sharing one micro lens, and the focus detection method includes the steps of detecting saturation of a first signal obtained from the first pixel, detecting saturation of a second signal obtained from the second pixel, generating luminance signals of the first signal and the second signal after the saturations of the first signal and the second signal are detected, and performing a correlation calculation based on the luminance signals.

Further features and aspects of the present invention will become apparent from the following description of exemplary embodiments with reference to the attached drawings.

DETAILED DESCRIPTION OF THE PREFERRED EMBODIMENTS

Figure 1:
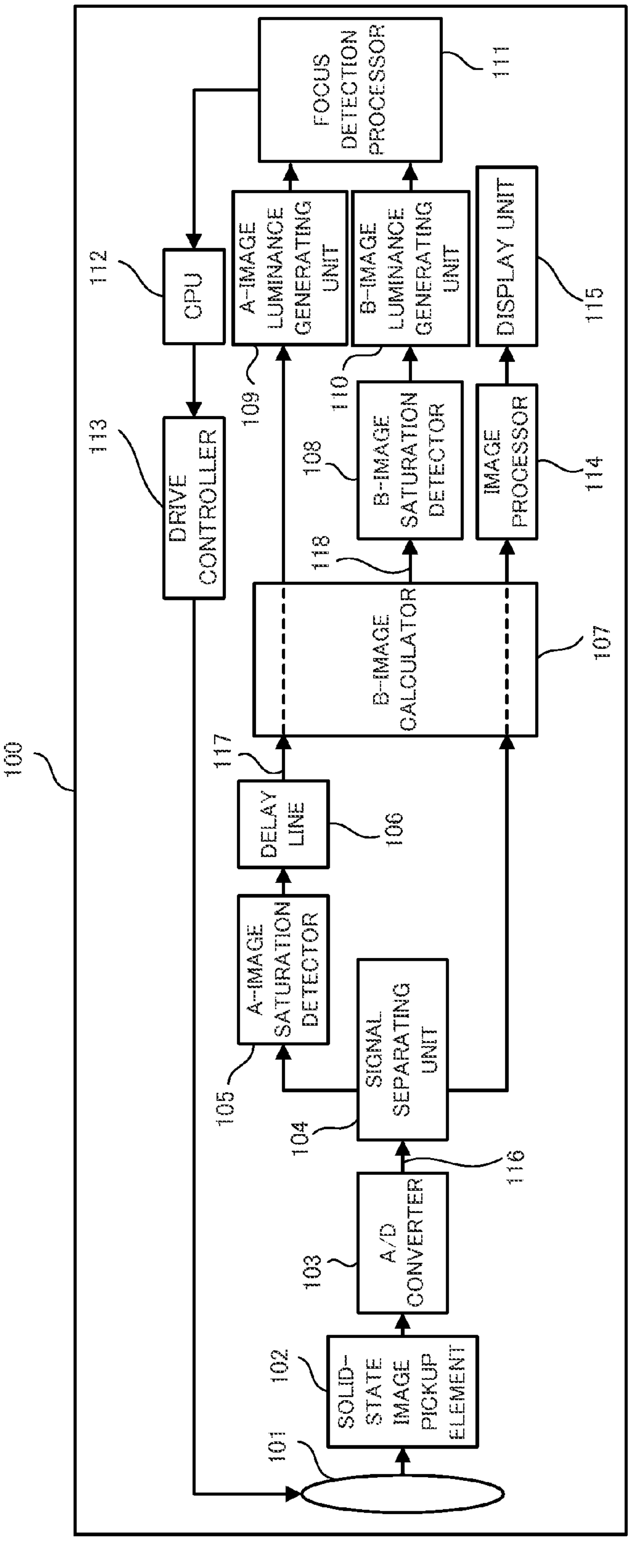
FIG. 1 is a block diagram illustrating a schematic configuration of an image pickup apparatus in the present embodiment.

Exemplary embodiments of the present invention will be described below with reference to she accompanied drawings. In each of the drawings, the same elements will be denoted by the same reference numerals and the duplicate descriptions thereof will be omitted.

First of all, referring to FIG. 1, a configuration of an image pickup apparatus in the present embodiment will be described. FIG. 1 is a block diagram illustrating a schematic configuration of the image pickup apparatus 100. The image pickup apparatus 100 includes a focus detection apparatus which performs focus detection of a phase difference method by using signals from an image pickup element (the solid-state image pickup element 102) including a plurality of pixels forming pairs of pixels (the first pixel, the second pixel), the pixels of each pair sharing one micro lens.

In FIG. 1, reference numeral 101 denotes an optical system unit including on optical lens unit containing a focusing lens to adjust a focus state, a shutter, an aperture stop, a lens controller, and the like. Drive control of the optical system unit 101 is performed based on an output from a drive controller 113 described below. Reference numeral 102 denotes a solid-state image pickup element in which pixel unit cells described below are arranged in a two-dimensional matrix. An exposure amount of the solid-state image pickup element 102 is controlled by operation of the shutter provided in the optical system unit 101. In the present embodiment, the optical system unit 101 is configured integrally with the image pickup apparatus 100, but the embodiment is not limited to this. The present embodiment can also be applied to an image pickup system in which the lens apparatus (the optical system unit 101) that is removable from the image pickup apparatus 100 (an image pickup apparatus body) is mounted on the image pickup apparatus 100.

Figure 2:
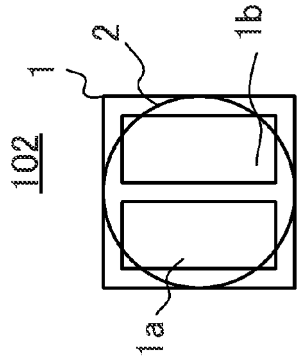
FIG. 2 is a plan view of a pixel unit cell in a solid-state image pickup element in the present embodiment.

Subsequently, referring to FIG. 2, a pixel unit cell in the solid-state image pickup element 102 in the present embodiment will be described. FIG. 2 is a plan view of the pixel unit cell. In FIG. 2, reference numeral 1 denotes a pixel unit cell, and a plurality of the pixel unit cells 1 are arranged inside the solid-state image pickup element 102. References numeral 1*a* and 1*b* denote pixels each including a photoelectric conversion element (PD). Signals from the pixels 1*a* and 1*b* are configured to be able no be output independently of each other. Color filters of the same color are provided on the pixels 1*a* and 1*b*.

Reference numeral 2 denotes a micro lens. The plurality of pixels 1*a* and 1*b* which are disposed under one micro lens 2 are treated as divided PDs which take incident lights through the same micro lens 2. The pixels 1*a* and 1*b* can obtain a plurality of different images (an A-image pixel, signal and a B-image pixel signal) obtained by the pupil division in accordance with their arrangements. The A-image pixel signal and the B-image pixel signal can be added in the solid-state image pickup element 102 to be read out, and the added pixel signal which is read out is a imaging pixel signal.

As described above, in the solid-state image pickup element 102, the pixel unit cells 1 are repeatedly (two dimensionally) arranged in Bayer array. The solid-state image pickup element 102 can read out charges accumulated in the divided PDs (the pixels 1*a* and 1*b*) of each pixel unit cell 1 selectively in a non-destructive manner, or can add the values accumulated in the divided PDs (the pixels 1*a* and 1*b*) under the same micro lens 2 to read out the added value. Here, the "non-destructive" manner means a state where a pixel signal is maintained in a pixel even after the pixel signal is read out from the pixel. The solid-state image pickup element 102 reads out (performs a non-destructive reading of) the A-image pixel signals of one line in a horizontal direction, and then reads out the added pixel signals obtained by adding the A-image pixel signals and the B-image pixel signals for the same line so as to sequentially perform this procedure.

The A/D converter 103 converts an analog electric signal output from the solid-state image pickup element 102 into a digital electric signal and then outputs the digital electric signal to a signal separating unit 104. The signal separating unit 104 (a signal separating portion) determines types of the input pixel signal. When a pixel signal is the A-image pixel signal, the signal separating unit 104 outputs the pixel signal to an A-image saturation detector 105 (a first saturation detector). On the other hand, when a pixel signal is the imaging pixel signal (an added signal of the A-image pixel signal and the B-image pixel signal), the signal separating unit 104 outputs the pixel signal to the B-image calculator 107. Thus, the signal separating unit 104 sequentially inputs the A-image pixel signal (the first signal) and the imaging pixel signal (the third signal) which is the added signal obtained by adding she A-image pixel signal and the B-image pixel signal (the second signal), and separates the A-image pixel signal and the imaging pixel signal.

The A-image saturation detector 105 (the first saturation detector) detects saturation of the A-image pixel signal (the first signal) obtained from the pixel 1*a* (the first pixel). That is, the A-image saturation detector 105 determines whether the input pixel signal (the A-image pixel signal) reaches a predetermined saturation level or not, and outputs the pixel signal with a saturation bit attached thereto so the delay line 106. When the input pixel signal reaches the predetermined saturation level, the A-image saturation detector 105 determines that the pixel signal is a saturated pixel. In this case, the A-image saturation detector 105 attaches 1 as the saturation bit to the most significant bit (MSB) or the least significant bit (LSB) of this pixel signal. As for such attaching of the saturation bit, a part of a pixel signal may be treated as a saturation bit. A polarity of the saturation bit is also not limited to a certain polarity.

An A-image pixel signal which is output from the A-image saturation detector 105 is input to the delay line 106 (a storage portion). The delay line 106 matches the timings of the A-image pixel signal which is output from the A-image saturation detector 105 and the corresponding imaging pixel signal (the added signal of the A-image pixel signal and the corresponding B-image signal) which is output from the signal separating unit 104, and outputs these pixel signals to the B-image calculator 107. That is, the delay line 106 stores the A-image pixel signal so that the timings of the A-image pixel signal and the corresponding imaging pixel signals which are separated by the signal separating unit 104 and sequentially output match each other. In the present embodiment, the delay line 106 is configured by including a plurality of delay elements, but the configuration of the delay line 106 is not limited to this. When the A-image pixel signal from the delay line 106 and the corresponding imaging pixel signal from the signal separating unit 104 are input to the B-image calculator 107, the B-image calculator 107 calculates the B-image pixel signal by a calculation processing described below to output the B-image pixel signal.

Figure 3:
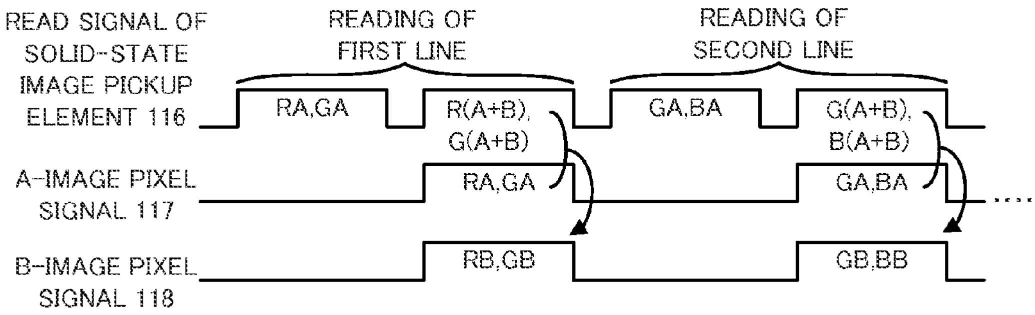
FIG. 3 is a timing chart of describing a calculation of a B-image pixel signal in the present embodiment.

Next, referring to FIG. 3, a method of calculating the B-image pixel signal in the present embodiment will be described. FIG. 3 is a timing chart of describing the method of calculating the B-image pixel signal. In FIG. 3, a read signal from the solid-state image pickup element is a pixel signal read out from the solid-state image pickup element 102, which corresponds to an output signal from the A/D converter 103.

In the solid-state image pickup element 102, two divided PDs (pixels 1*a* and 1*b*) are provided under the same micro lens 2 and color filters are provided on the micro lenses 2 in the Bayer array. Symbols RA, GA, and BA indicate A-image pixel signals 117 (pixel signals read out in a no-destructive reading manner) of pixels corresponding to the micro lenses 2 provided with red, green and blue color filters, respectively. Symbols R(A+B), G(A+B), and B(A+B) indicate added signals (added and read pixel signals) of the divided PDs (the pixels 1*a* and 1*b*) corresponding the same micro lenses 2 provided with the red, green, and blue color filters, respectively. Symbols RB, GB, and BB indicate a B-image pixel signal 118 obtained by subtracting the A-image pixel signals RA, GA, and BA from the added signals R(A+B) G(A+B), and B(A+B), respectively. In FIG. 3, the A-image pixel signal 117 corresponds to the output of the delay line 106, and the B-image pixel signal 118 corresponds to the output of the B-image calculator 107.

As for a non-destruction reading of the first line in the solid-state image pickup element 102, the A-image pixel signals RA and GA are read. When the non-destructive readings of the A-image pixel signals RA and GA are completed, subsequently, the solid-state image pickup element 102 reads the added signals R(A+B) and C(A+B) as the added values of the divided PDs. In this case, in order to obtain the B-image pixel signals RB and GB, the A-image pixel signals RA and GA are delayed for one line by using the delay line 106 and are subtracted from the added signals R(A+B) and G(A+B). As for reading of the second line in the solid-state image pickup element 102, the similar procedure is performed by changing the color filters R and G to color filters G and B.

Figure 4:
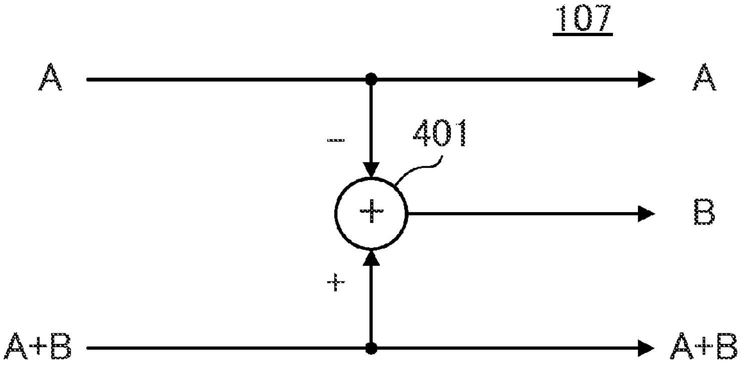
FIG. 4 is a diagram of a circuit configuration of a B-image calculator in the present embodiment.

Next, referring to FIG. 4, a configuration and operation of the B-image calculator 107 in the present embodiment will be described. FIG. 4 is a diagram of a circuit configuration of the B-image calculator 107. In the B-image calculator 107, the A-image pixel signal output via the delay line 106 and the imaging pixel signal (the added signal) of each color from the signal separating unit 104 are input. The A-image pixel signal (A) is divided into a path where the signal is output to the next stage while remaining as it is and to a path to be input to the subtracting portion 401. The imaging pixel signal (A+B) is also divided into a path where the signal is output to the next state while remaining as it is and to a path to be input to the subtracting portion 401.

The B-image calculator 107 (a calculator) calculates the B-image pixel signal by performing the calculation represented by the following Expression (1) by using the A-image pixel signal (A) and the imaging pixel signal (A+B) which are input to the subtracting portion 401.

$$B=(A+B)-A \qquad (1)$$

That is, the B-image calculator 107 calculates the B-image pixel signal by subtracting the A-image pixel signal output from the delay line 106 from the imaging pixel signal. The B-image pixel signal (B) output from the subtracting portion 401, i.e. the B-image pixel signal calculated by the B-image calculator 107, is sequentially output to the B-image saturation detector 108. The B-image saturation detector 108 determines whether the input pixel signal (the B-image pixel signal) reaches a predetermined saturation level or not, and outputs the pixel signal with a saturation bit attached thereto to the B-image luminance generating portion 110.

The B-image saturation detector 108 (a second saturation detector) detects saturation of a B-image pixel signal (the second signal) obtained from the pixel 1*b* (the second pixel). When the input pixel signal reaches the predetermined saturation level, the B-image saturation detector 108 determines that the pixel signal is a saturated pixel. In this case, the B-image saturation detector 108 attaches 1 as a saturation bit to the most significant bit (MSB) or the least significant bit (LSB) of the pixel signal. As for such attaching of the saturation bit, a part of a pixel signal may be treated as a saturation bit. A polarity of a saturation bit is also not limited to a certain polarity.

The A-image pixel signal output from the B-image calculator 107 is input to an A-image luminance generating unit 109. The A-image luminance generating unit 109 (a luminance generating portion) generates a luminance signal YA of an A-image (the luminance signal of the first signal) based on the input A-image pixel signal (the first signal).

Figure 5:
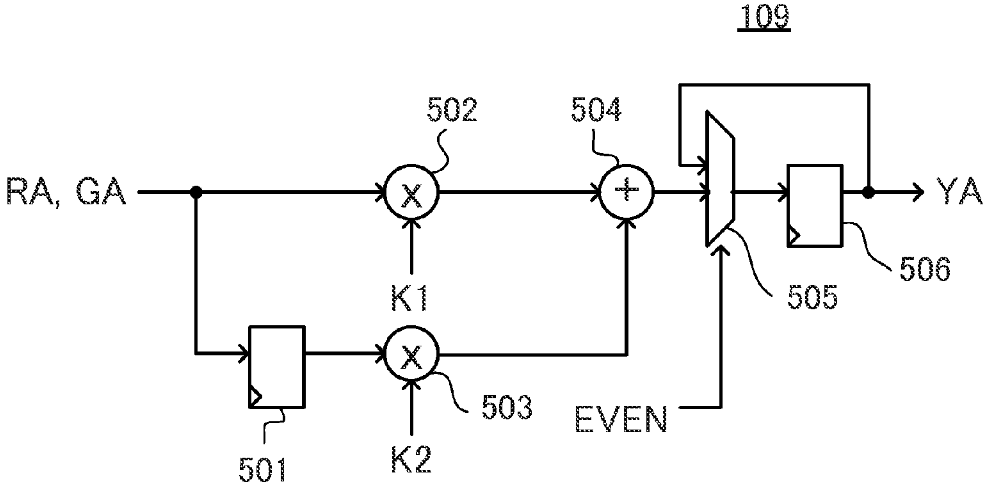
FIG. 5 is a diagram of a circuit configuration of an A-image luminance generating portion in the present embodiment.

Next, referring to FIG. 5, a circuit configuration of the A-image luminance generating unit 109 in the present embodiment will be described. FIG. 5 is a circuit configuration of the A-image luminance generating unit 109. Here, a case where A-image pixel signals RA and GA forming the first horizontal line are input to the A-image luminance generating unit 109 will be described. In the A-image luminance generating unit 109, the A-image pixel signals RA and GA are input sequentially in the horizontal direction.

One of the A-image pixel signals RA and GA which are input is output to the multiplication portion 503 via a flip-flop 501 for matching the timing. The A-image pixel signals RA and GA are multiplied by predetermined coefficients K1 and K2 in the multiplying portions 502 and 503, respectively, to be output to an adding portion 504. The A-image pixel signals RA and GA are added in the adding portion 504, and the added value is output as a component signal (the luminance signal YA of the A-image) which is a part of the luminance signal Y. In this case, an H counter (not shown) determines whether the input pixel is an even-numbered pixel or an odd-numbered pixel. When the input pixel is an even-numbered pixel EVEN, the luminance signal YA of the A-image is output to the next stage via a multiplexer 505 and a flip-flop 506. In the present embodiment, a case where the first horizontal line is input is described. However, if the A-image pixel signals GA and BA are input, values of the coefficients K1 and K2 change.

The B-image pixel signal output from the B-image saturation detector 108 is input to a B-image luminance generating unit 110. The B-image luminance generating unit 110 (a luminance generating portion) generates a luminance signal YB of the B-image (a luminance signal of the second signal) based on the B-image pixel signal (the second signal) which is input after the saturation is detected. Here, the B-image luminance generating unit 110 has a similar circuit configuration as that of the A-image luminance generating unit 109 described with reference to FIG. 5.

The focus detection processor 111 obtains a defocus amount based on the luminance signal YA of the A-image and the luminance signal YB of the B-image obtained from the pixels 1*a* and 1*b* (the A-image pixel and the B-image pixel) which are provided corresponding to the same micro lens 2, and outputs the obtained defocus amount to the CPU 112. The CPU 112 (a processor) performs a correlation calculation by using the defocus amount obtained based on the luminance signals YA and YB. When the focus detection of the phase difference method is performed as described in the present embodiment, a correlation calculation result that does not depend on a color of an object can be obtained by the calculation using the luminance signal.

Figures 6A, 6B, 6C:
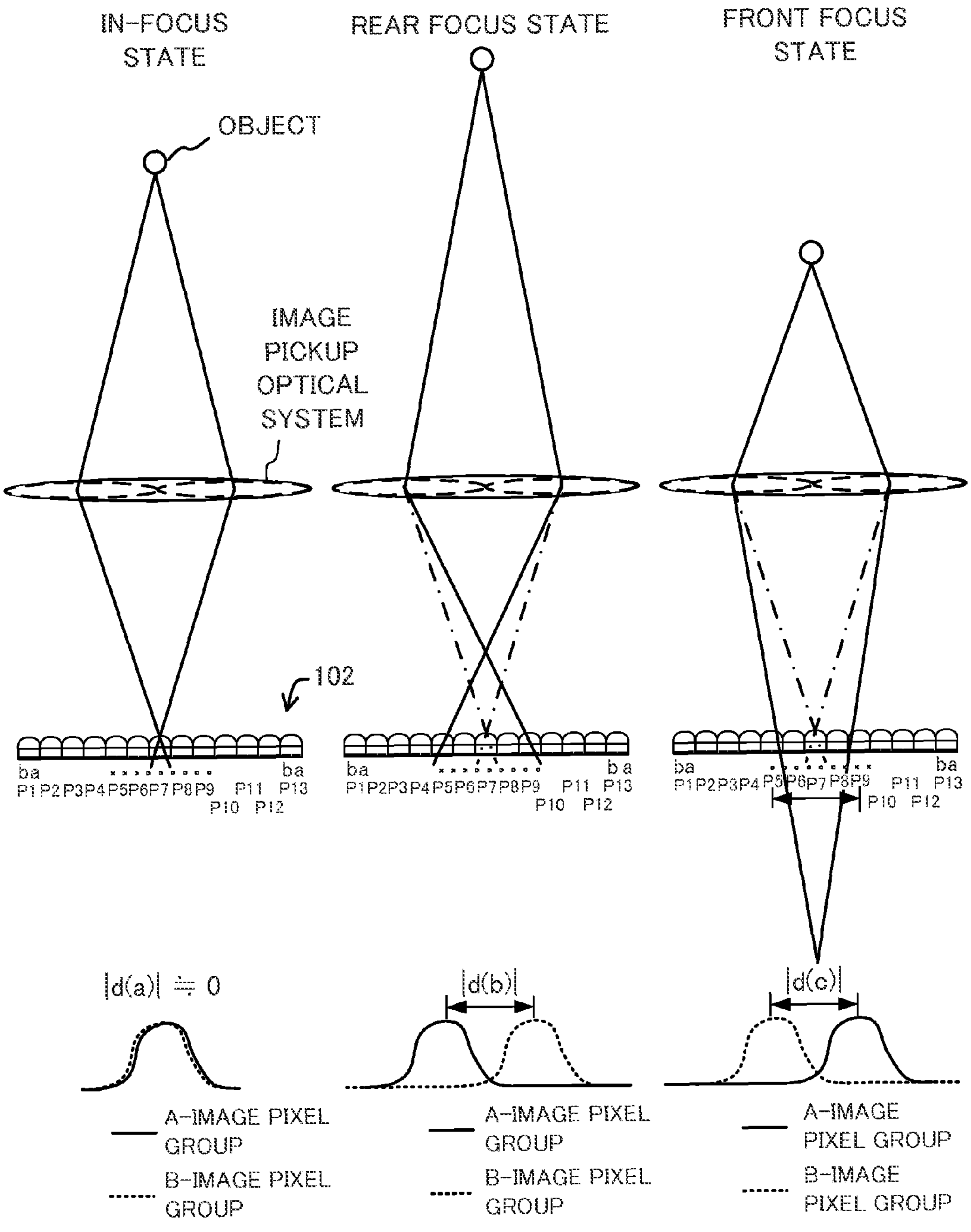
FIGS. 6A to 6C are schematic views of cases where focus detection operation (an in-focus operation) is performed by using pixel values of divided PDs in the present embodiment.

Next, referring to FIGS. 6A to 6C, a focus detection operation (an in-focus operation) of the image pickup apparatus 100 in the present embodiment will be described. FIGS. 6A to 6C are schematic views of cases where the focus detention operation (the in-focus operation) is performed by using pixel values of the divided PDs (the pixels 1*a*, 1*b*) in the present embodiment.

In each of FIGS. 6A to 6C, a plurality of pixel unit cells P (P1 to P13) each of which including pixels a and b are arranged for each of the same micro lens 2 in the solid-state image pickup element 102. A light beam from an object with respect to the pixels a and b (the pixels 1*a* and 1*b*) disposed under the micro lens 2 passes through divided pupils corresponding to the pixels a and b in the image pickup optical system, and the light beam is divided into light beams which enter the respective pixels a and b.

When performing the focus detection, the output of the A-image pixel and the output of the B-image pixel from the pixels a and b are combined in a line direction (or in a row direction) and the A-image and the B-image are generated and data of the images are created as outputs of a pixel unit cell group of the same color to obtain a shift between the corresponding points by a correlation calculation.

The correlation calculation result is obtained by the following Expression (2).

$$C=\Sigma|YAn-YBn| \tag{2}$$

In Expression (2), symbol n is the number (n-th) indicating a micro lens in the horizontal direction. Symbols YAn and YBn are the A-image luminance signal and the B-image luminance signal corresponding to the n-th micro lens. Values which are obtained by shifting the corresponding pixel with respect to the B-image luminance signal YBn are plotted, and the position where a shift amount is minimized is an in-focus position.

When the focus state is in the in-focus state as illustrated in FIG. 6A, an object image is formed (imaged) on the pixels a and b of the pixel unit cell P7. Therefore, the A-image pixel group (the pixels a) and the B-image pixel group (the pixels b) approximately match each other. In this case, an image shift amount d (a) between the A-image pixel group and the B-image pixel group obtained by the correlation calculation is approximately equal to 0 ($|d(a)|\approx 0$). On the other hand, when the focus state is in a rear focus state as illustrated in FIG. 6B, the object image is formed (imaged) on the pixel a of the pixel unit cell P9 (the A-image pixel group) and the pixel b of the pixel unit cell P5 (the B-image pixel group). In this case, an image shift amount d (b) between the A-image pixel group and the B-image pixel group obtained by the correlation operation is generated. Further, when the focus state is in a front focus state as illustrated in FIG. 6C, the object image is formed (imaged) on the pixel a of the pixel unit cell P5 (the A-image pixel group) and the pixel b of the pixel unit cell P9 (the B-image pixel group). In this case, as an image shift amount between the A-image pixel group and the B-image pixel group calculated by the correlation calculation, an image shift amount d (c) is generated in a direction opposite to the direction of the image shift amount in the rear focus state.

This means that although the A-image pixel group and the B-image pixel group are looking at the same object in the in-focus state, the A-image pixel group and the B-image pixel group are looking at the object shifted by the image shift amount d in the rear focus state and in the front focus state. In reality, an in-focus control of the object is performed by obtaining the defocus amount using a well-known technology based on the obtained image shift amount d and a base-line length so as to move the image pickup optical system.

The focus detection processor 111 counts the number of saturated signals included in a pair of signals used to calculate the defocus amount, and outputs the result to the CPU 112, in addition to information relating to the defocus amount. Based on the defocus amount and the number of the saturated signals (saturated signal information) which are output from the focus detection processor 111, the CPU 212 outputs drive information of the focusing lens included in the optical system unit 101 to the drive controller 113. The CPU 112 further controls the entire system of the image pickup apparatus 100.

The drive controller 113 outputs the drive information such as a position of the focusing lens or a speed of the shutter included in the optical system unit 101, based on a control signal output from the CPU 112. The drive information means a moving distance (a driving amount of the optical system unit 101) obtained based on the defocus amount described above. An image processor 114 performs a digital signal processing such as a defective pixel correction, an AE, an AF, a white balance adjustment, a gamma adjustment, a noise reduction processing, or a synchronization processing, for the input imaging signal. Then, the image processor 114 outputs the imaging signal to a display unit 115 via a storage unit (DRAM) which is not shown. The display unit 115 displays an image (image file) obtained during shooting an image on a display device such as a liquid crystal panel via the storage unit (DRAM) which is not shown.

Figure 7:
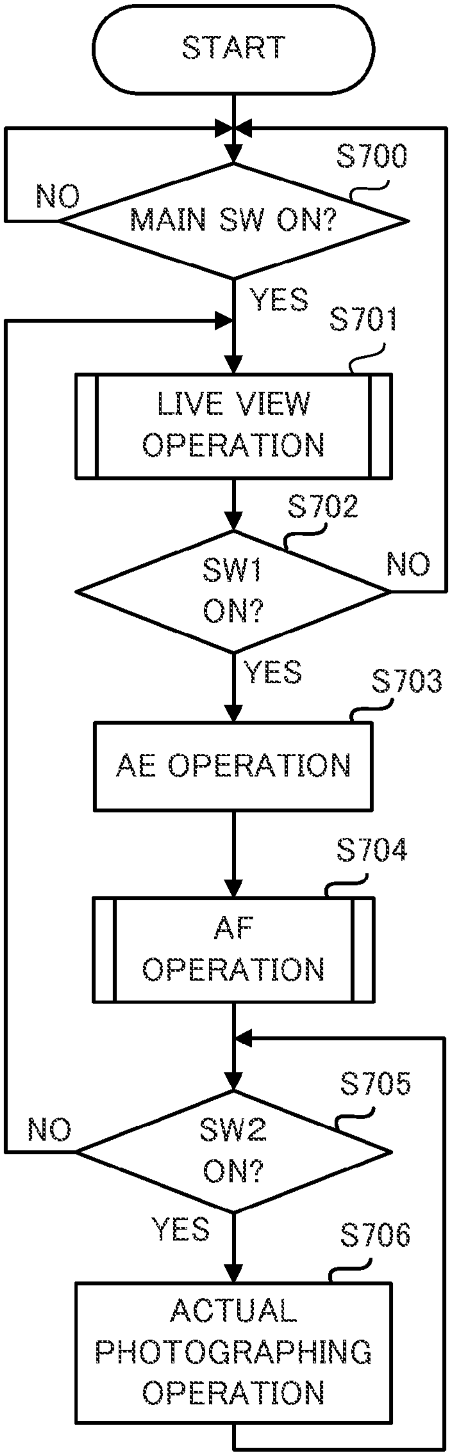
FIG. 7 is a flowchart illustrating an image pickup operation performed by a CPU in the present embodiment.

Next, referring to FIG. 7, a series of image pickup operations performed by the CPU 112 (a system controller) in the present embodiment will be described. FIG. 7 is a flowchart illustrating the image pickup operation performed by the CPU 112.

First of all, in step S700, the CPU 112 determines a condition of a main SW (now shown) of the image pickup apparatus 100 (a condition of power ON or OFF). When the power is ON in step S700, the flow proceeds to step S701. On the other hand, when the power is OFF in step S700, the determination of step S700 is repeated until the power is turned ON.

In step S701, the CPU 112 performs a series of operations to perform the live view operation. Details of the live view operation will be described below. Subsequently, in step S702, the CPU 112 determines the condition of the switch SW1 which is not shown (the condition of ON or OFF). When the switch SW1 is ON in step S702, the flow proceeds to step S703 to perform an image pickup standby operation before performing an actual photographing. On the other hand, when the switch SW1 is OFF in seep S702, the flow returns to step S700.

In step S703, the CPU 112 determines an exposure of an image using an exposure correction value which is previously set by an exposure setting portion (not shown) based on image information obtained by the live view operation (an AE operation). Then, the CPU 112 outputs an aperture value (an F number) and a shutter speed (an exposure time) to the drive controller 113 in accordance with the determined exposure. Subsequently, in step S704, the CPU 112 performs the AF operation based on the defocus amount obtained in the live view operation and the number (the quantity) of the saturate pixels output from the focus detection processor 111. Details of the AF operation in the present embodiment will be described below.

Next, in step S705, the CPU 112 determines the condition of the switch SW2 which is not shown (the condition of ON or OFF). When the switch SW2 is ON in step S705, the flow proceeds to step S706 to perform the actual photographing. On the other hand, when the switch SW2 is OFF in step S705, the flow returns to step S701.

In step S706, the CPU 112 controls the entire system of the image pickup apparatus 100 so as to perform the actual photographing operation, and the flow returns to step S705.

In the present embodiment, the actual photographing operation means to perform a charge clearing operation and a charge accumulation stars operation with respect to the solid-state image pickup element 102 and to open the shutter by controlling the optical system unit 101 via the drive controller 113 based on the exposure determined in step S703.

The solid-state image pickup element 102 starts the exposure of the actual photographing image and closes the shutter by controlling the optical system unit 101 in accordance with the exposure (an exposure time) determined, in step S703. In this case, the solid-state image pickup element 102 finishes the charge accumulation and reads out the added values of the divided PDs (the pixels 1*a* and 1*b*). The read charges are output and stored in a memory card such as a SD card (not shown) via the A/D converter 103, the signal separating unit 104, and the image processor 114.

Figure 8:
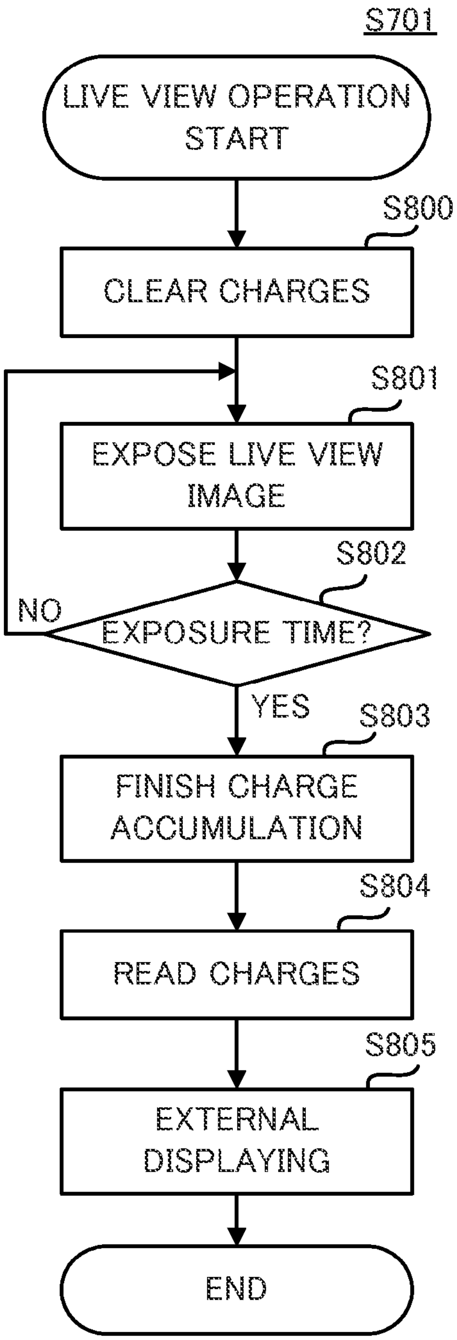
FIG. 8 is a flowchart illustrating a subroutine of a live-view operation in the present embodiment.

Next, referring to FIG. 8, the live view operation performed in step S701 of FIG. 7 will be described. FIG. 8 is a flowchart illustrating a subroutine of the live view operation. First of all, in step S800, the CPU 112 clears the charges accumulated in the solid-state image pickup element 102. Subsequently, in step S801, the CPU 112 starts the charge accumulation in the solid-state image pickup element 102 by exposing a live view image. Then, in step S802, the CPU 112 determines whether a predetermined exposure time has elapsed. When she predetermined exposure time has elapsed in step S802, the flow proceeds to step S803. On the other hand, when the predetermined exposure time has not elapsed, the flow returns to step S801.

In step S803, the CPU 112 finishes the charge accumulation in the solid-state image pickup element 102 by controlling the electronic shutter. Subsequently, in step S804, the signal separating unit 104 separates the A-image pixel signal and the imaging pixel signal and reads out the charges accumulated in the solid-state image pickup element 102. In step S805, the display urn 115 output an image for a live view to an external display device such as a liquid crystal display (not shown) based on an output from the image processor 114 (an external display).

Figure 9:
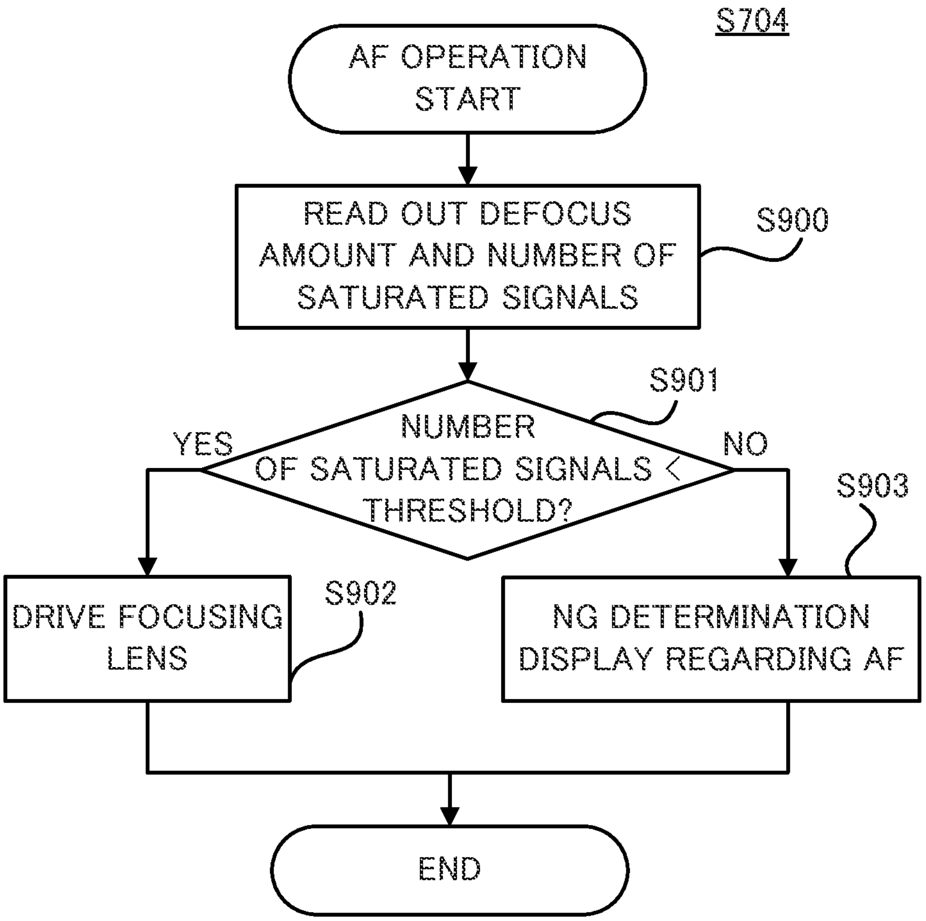
FIG. 9 is a flowchart illustrating a subroutine of an AF operation in the present embodiment.

Next, referring to FIG. 9, the AF operation in step S704 of FIG. 7 will be described. FIG. 9 is a flowchart illustrating a subroutine of the AF operation. First of all, in step S900, the CPU 112 reads out the defocus amount and the number of the saturated signals output from the focus detection processor 111.

Subsequently, in step S901, the CPU 112 determines whether the number of the read saturated signals is smaller than a predetermined threshold value. When the number of the saturated signals is smaller than the predetermined threshold value in step S901, she CPU 112 determines that the reliability of the focus detection is high and the flow proceeds to step S902. In step S902, the CPU 112 outputs a focusing lens drive control signal based on the defocus amount to the drive controller 113. Then, the drive controller 113 drives the focusing lens based on the focusing lens drive control signal.

On the other hand, when the number of the saturated signals is equal to or greater than a predetermined threshold value in step S901, the CPU 112 determines that the reliability of the focus detection is low and the flow proceeds to step S903. In step S903, the CPU 112 outputs a control signal for an NG determination display regarding the AF to the display unit 115. Then, the display unit 115 displays the NG determination information regarding the AF in an external display device such as a liquid crystal display (not shown).

According to the present embodiment, saturation of each of divided PD units can be detected, that is, saturation for each of an A-image pixel and a B-image pixels can be detected before focus detection process is performed. Therefore, focus detection can be performed by taking deterioration in a phase difference image into consideration. Consequently, according to the present embodiment, a focus detection apparatus, an image pickup apparatus, an image pickup system, and a focus detection method which improve focus detection accuracy can be provided.

While the present invention has been described with reference to exemplary embodiments, it is to be understood that the invention is not limited to the disclosed exemplary embodiments. The scope of she following claims is to be accorded the broadest interpretation so as to encompass all such modifications and equivalent structures and functions.

This application claims the benefit of Japanese Patent Application No. 2012-261430, filed on Nov. 29, 2012, which is hereby incorporated by reference herein in its entirety.

What is claimed is:

1. A focus detection apparatus which performs focus detection of a phase difference method by using signals from an image pickup element including a first pixel and a second pixel sharing one micro lens, the focus detection apparatus comprising:

- a signal separating portion configured to sequentially input a first signal obtained from the first pixel and a third signal that is an added signal of the first signal and a second signal obtained from the second pixel and separate the first signal and the third signal;
- a first saturation detector configured to detect saturation of the first signal;
- a second saturation detector configured to detect saturation of the second signal;
- a luminance generating portion configured to generate luminance signals of the first signal and the second signal after a saturation process of the first signal and the second signal is performed; and
- a processor configured to perform a correlation calculation based on the luminance signals.

2. The focus detection apparatus according to claim 1, further comprising:

- a storage portion configured to store the first signal so that timings of the first signal and the third signal which are separated by and sequentially outputted from the signal separating portion are matched; and
- a calculator configured to subtract the first signal, which is output from the storage portion, from the third signal so as to calculate the second signal.

3. The focus detection apparatus according to claim 2, wherein the storage portion is a delay line including a plurality of delay elements.

4. The focus detection apparatus according to claim 1,

- wherein the first saturation detector detects the saturation of the first signal when the first signal exceeds a predetermined level, and
- wherein the second saturation detector detects the saturation of the second signal when the second signal exceeds a predetermined level.

5. The focus detection apparatus according to claim 1, further comprising a focus detector configured to perform focus detection based on a result of the correlation calculation and a result of saturation detections detected by the first and second saturation detector.

6. The focus detection apparatus according to claim 1, wherein the first pixel and the second pixel are provided with a plurality of color filters.

7. The focus detection apparatus according to claim 3, wherein the plurality of delay elements are provided for each of a plurality of color filters.

8. The focus detection apparatus according to claim 1, wherein the first signal is read from the image pickup element in a non-destructive manner.

9. An image pickup apparatus comprising:

an image pickup element including a first pixel and a second pixel sharing one micro lens;

a signal separating portion configured to sequentially input a first signal obtained from the first pixel and a third signal that is an added signal of the first signal and a second signal obtained from the second pixel and separate the first signal and the third signal;

a first saturation detector configured to detect saturation of the first signal;

a second saturation detector configured to detect saturation of the second signal;

a luminance generating portion configured to generate luminance signals of the first signal and the second signal after a saturation process of the first signal and the second signal is performed;

a processor configured to perform a correlation calculation based on the luminance signals; and a focus detector configured to perform focus detection based on a result of the correlation calculation.

10. An image pickup system comprising:

an image pickup apparatus including:

an image pickup element including a first pixel and a second pixel sharing one micro lens;

a signal separating portion configured to sequentially input a first signal obtained from the first pixel and a third signal that is an added signal of the first signal and a second signal obtained from the second pixel and separate the first signal and the third signal;

a first saturation detector configured to detect saturation of the first signal;

a second saturation detector configured to detect saturation of the second signal;

a luminance generating portion configured to generate luminance signals of the first signal and the second signal after a saturation process of the first signal and the second signal is performed;

a processor configured to perform a correlation calculation based on the luminance signals; and a focus detector configured to perform focus detection based on a result of the correlation calculation; and a lens apparatus removably mounted on the image pickup apparatus.

11. A focus detection method of performing focus detection of a phase difference method by using signals from an image pickup element including a first pixel and a second pixel sharing one micro lens, the focus detection method comprising the steps of:

sequentially inputting a first signal obtained from the first pixel and a third signal that is an added signal of the first signal and a second signal obtained from the second pixel and separating the first signal and the third signal;

detecting saturation of the first signal;

detecting saturation of the second signal;

generating luminance signals of the first signal and the second signal after a saturation process of the first signal and the second signal is performed; and performing a correlation calculation based on the luminance signals.

* * * * *